United States Patent [19]

Yamamoto et al.

[11] Patent Number: 5,550,465
[45] Date of Patent: Aug. 27, 1996

[54] DRIVING APPARATUS FOR CROSS-COIL TYPE ANALOG INDICATING INSTRUMENT

[75] Inventors: Tomohisa Yamamoto, Hoi-gun; Junji Hayakawa, Okazaki; Hiroyuki Ban, Hazu-gun, all of Japan

[73] Assignee: Nippondenso Co., Ltd., Kariya, Japan

[21] Appl. No.: 442,340

[22] Filed: May 16, 1995

[30] Foreign Application Priority Data

May 23, 1994 [JP] Japan .................................. 6-108187

[51] Int. Cl.⁶ ...................................................... G01R 5/16
[52] U.S. Cl. ............................................. 324/143; 324/146
[58] Field of Search .................................... 324/143, 144, 324/146, 163, 166, 167

[56] References Cited

U.S. PATENT DOCUMENTS 5,121,347  6/1992  Yamamoto et al. .................. 364/570

5,313,155  5/1994  Yamamoto et al. .................. 324/143

*Primary Examiner*—Gerard R. Strecker
*Attorney, Agent, or Firm*—Cushman, Darby & Cushman

[57] ABSTRACT

A pulse signal generated by a car speed sensor is converted to an analog voltage by a F-V converter, and two sawtooth signals are formed by two sawtooth current generators based on the analog voltage. The sawtooth currents are then converted into two triangular wave voltages by two I-V converters. Three-stage function generators change the slope of each of the triangular wave voltages step by step and form an approximated sine wave voltage and an approximated cosine wave voltage. A zero-cross compensating circuit is provided in each of the first stage function generators and adjust the triangular voltage to cross zero point.

11 Claims, 8 Drawing Sheets

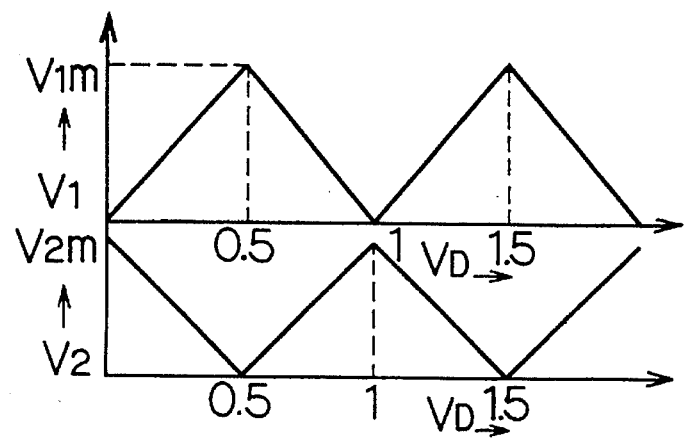
FIG.4A
FIG.4B
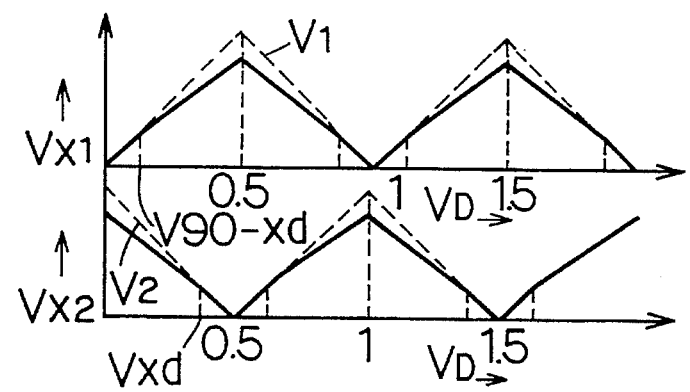
FIG.4C
FIG.4D
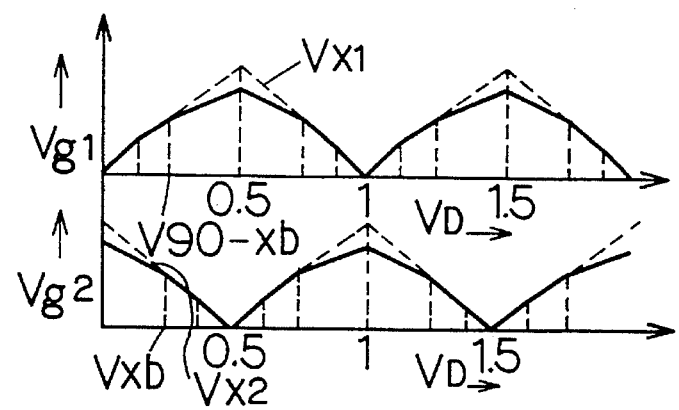
FIG.4E
FIG.4F
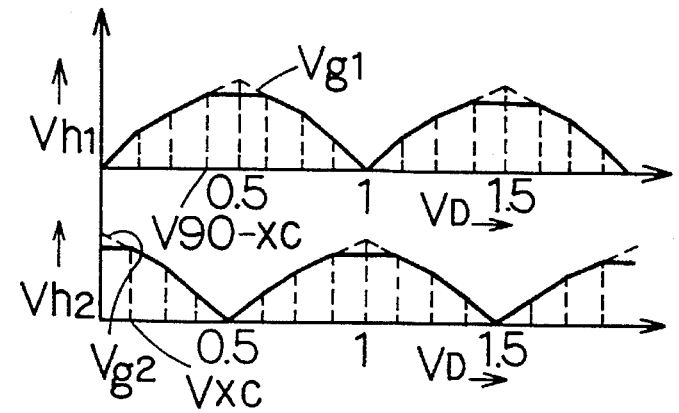
FIG.4G
FIG.4H

DRIVING APPARATUS FOR CROSS-COIL TYPE ANALOG INDICATING INSTRUMENT

CROSS REFERENCE TO RELATED APPLICATION

The present application is based on and claims priority from Japanese Patent Application No. Hei 6-108187 filed on May 23, 1994, the contents of which are incorporated herein by reference.

BACKGROUND OF THE INVENTION

1. Field of the Invention

The present invention relates to a cross-coil type analog indicating instrument provided with a pair of coils arranged in quadrature which drives a pointer of the instrument according to a composite electromagnetic force generated by the coils.

2. Description of the Related Art

There are related prior art devices disclosed in U.S. Pat. No. 5,121,347 and U.S. Pat. No. 5,313,155 which were patented to the assignee of this application. In the above-mentioned prior art devices, a car-speed signal generated by a car-speed signal sensor is converted into a voltage signal, and two different phase sawtooth currents are generated according to the voltage signal as exemplified in FIG. 3A and FIG. 3B of this application. The saw tooth currents are then converted by respective I-V converters into triangular wave voltages as exemplified in FIG. 4A and FIG. 4B. Thereafter, the wave slope of the triangular voltages are changed by first and second stage function generators to provide approximated sinusoidal function voltages. Subsequently, a rectilinearly approximated sine wave current and a rectilinearly approximated cosine wave current are formed based on the function voltages and supplied to the cross-coils to drive a pointer of an analog indicating instrument.

In the above mentioned prior art device, when the function voltages are formed by changing the slope of the triangular voltage waves, it is necessary to provide two different phase triangular wave voltages one of which turns its direction at the zero volt point where an input analog voltage VD (an output voltage of F-V converter 50 shown in FIG. 1) is equal to 1 V ( which corresponds to the pointer rotation angle 180°) as exemplified in FIG. 4A, and the other of which turns its direction at zero volt point when VD=0.5 V ( which corresponds to 90°) and VD=1.5 V ( which corresponds to 270°) as exemplified in FIG. 4B.

However, in the above prior art devices, such approximated sinusoidal function voltages may not turn the direction at the zero volt point on the prescribed phase angles due to variations of parts and components used in the device, and an approximated sine wave current or an approximated cosine wave current applied to the cross-coils become distorted. As a result, the cross-coils 11 and 12 generate a distorted rotating magnetic force which is the composite vector of these two currents, thereby resulting in that the pointer of the indicating instrument may jump or stagnate on a dial.

SUMMARY OF THE INVENTION

The present invention is made in view of the foregoing problems, and has a primary object of providing an improved cross-coil analog type indicating instrument in which a pointer of the instrument rotates smoothly and gives an accurate indication without jumping or stagnation of the pointer.

Another object of the present invention is to provide an improved cross-coil analog type indicating instrument in which a zero-crossing compensation means is provided to adjust first and second triangular voltage waves to turn the direction at its zero volt point on respective phase angles. With the compensation means, the current waves are formed into continuous rectilinear approximated sine and cosine waves, which are supplied to the cross-coils, so that the cross-coil generates a smooth rotating magnetic force and the pointer gives an accurate indication without stagnation or jumping.

A further object of the present invention is to provide an improved cross-coil analog type indicating instrument in which more desirable approximated sine and cosine waves are provided.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

FIGS. 4A, 4B, 4C, 4D, 4E, 4F, 4G, and 4H are wave-form charts illustrating voltage waves generated by I-V converters and by three stage function generators illustrated in FIG. 1;

DETAILED DESCRIPTION OF THE PREFERRED EMBODIMENT

Preferred embodiment according to the present invention will now be described with reference to the appended drawings.

Figure 1:
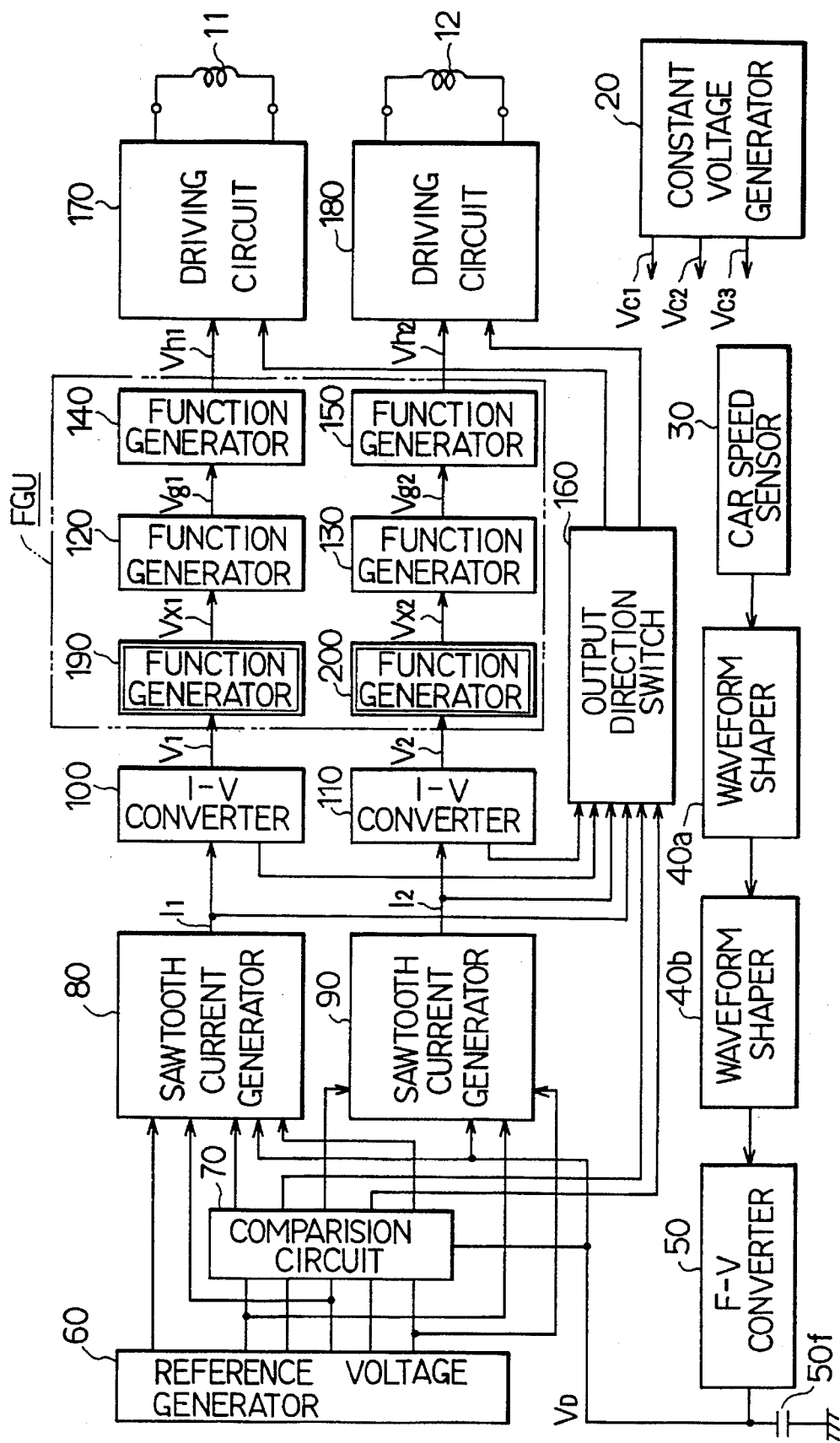
FIG. 1 is a block diagram illustrating a cross-coil type analog indicating instrument according to a first embodiment of the present invention.
Figure 2:
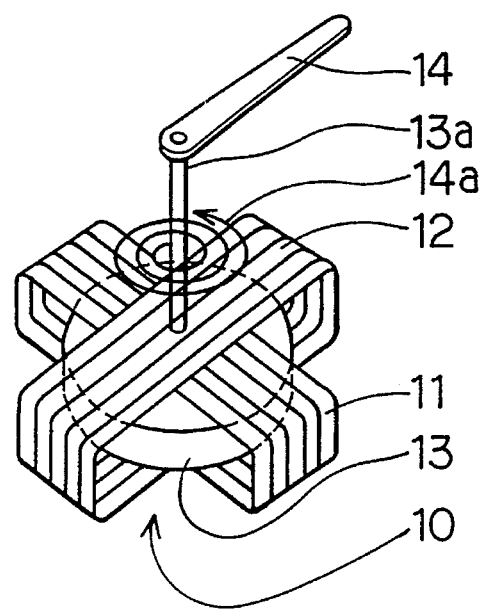
FIG. 2 is a schematic view illustrating the indicating instrument according to the present invention.

In FIG. 1 and FIG. 2, an analog indicating mechanism has a pair of cross-coils 11 and 12 arranged concentrically in quadrature and a disc 13 equipped with permanent magnets (not shown) disposed inside the coils 11 and 12. When a pair of alternating currents are supplied to the cross-coils, the coils 11 and 12 generate a magnetic rotating force as a composite vector of the currents which drives the disc 13 and a pointer 14. By the way, the most desirable rotating force is generated when each of the cross-coils is supplied with a composite vector of sine wave current and cosine wave current. A hair spring 14a is also disposed on the disc in a well-known manner to bias the pointer 14 toward its zero-starting point.

The driving apparatus shown in FIG. 1 relates to an apparatus disclosed in U.S. Pat. No. 5,313,155 (hereinafter referred to as the prior art patent), and therefore detailed description on the corresponding components and parts are omitted.

The driving apparatus shown in FIG. 1 starts operation when an ignition switch (not shown) of a car is turned on and electric current is supplied from a car battery (not shown). When the driving apparatus is energized, a constant voltage generator 20 generates constant voltages VC1, VC2 and VC3 on its terminals respectively to energize each circuit of the apparatus. When a speed sensor 30 generates a car-speed-pulse signal, it is wave-shaped by first and second wave-form shapers 40a and 40b, and is sent to F-V converter 50. The F-V converter generates an analog voltage signal VD proportional to the frequency of the car-speed-pulse signal. The rotation or output angle of the pointer corresponds to the analog voltage VD.

Figure 3A:
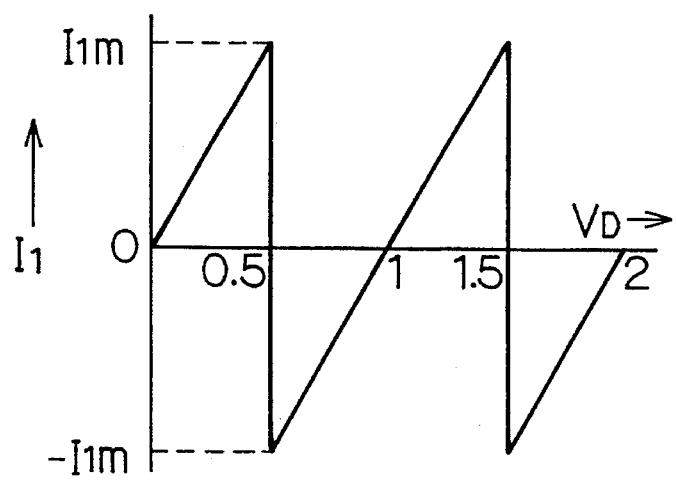
FIGS. 3A and 3B are wave-form charts illustrating output wave shapes generated by sawtooth current generators illustrated in FIG. 1.
Figure 3B:
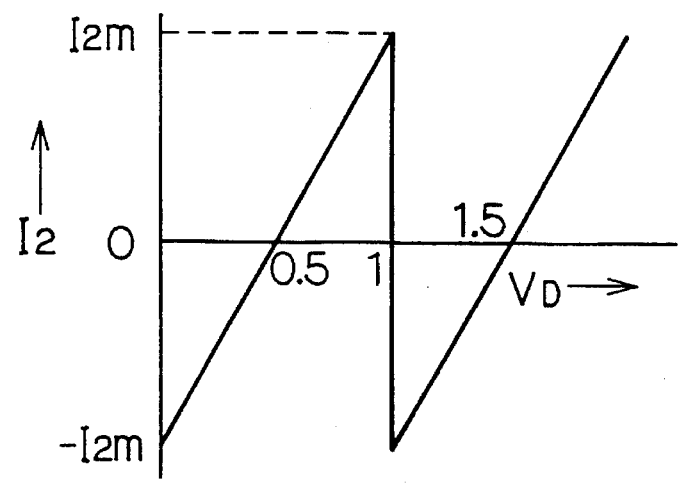
Figure 6:
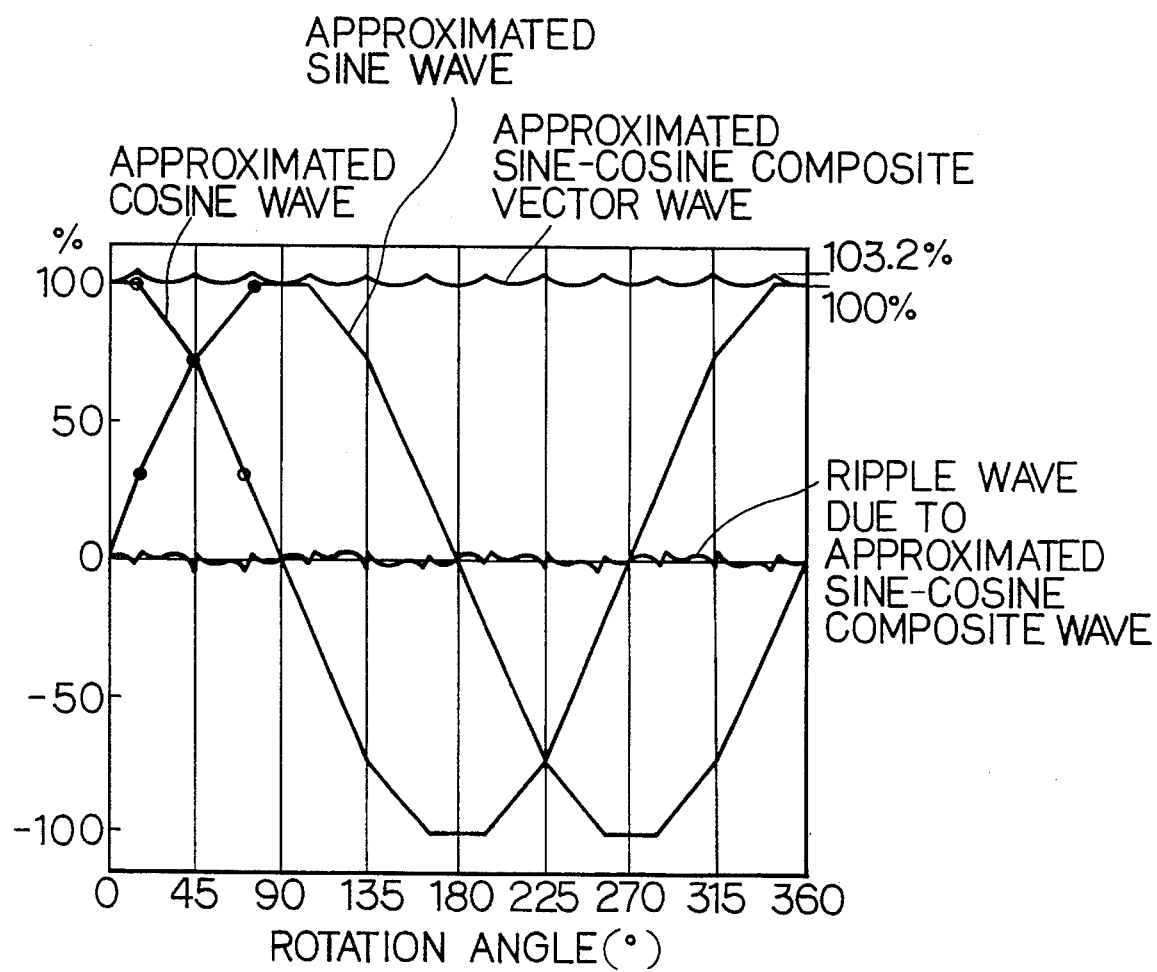
FIG. 6 is a wave-form chart illustrating approximated sine wave, cosine wave and composite vector wave of the approximated sine and cosine waves generated by a function generator unit according to a first embodiment of the present invention.

The voltage VD is subsequently applied to a comparison circuit 70 and sawtooth current generators 80 and 90, where sawtooth currents I1 and I2 are generated to change periodically as the analog voltage VD increases as shown in FIG. 3A and FIG. 3B. The sawtooth currents I1 and I2 are converted by I-V converters 100 and 110 into triangular wave voltages which turn the direction as the analog voltage VD increases. The triangular voltages are subsequently modified or deformed by a function generator unit FGU to form rectilinearly approximated sinusoidal function voltages Vh1 and Vh2, which are applied to driving circuits 170 and 180. An output direction switch 160 ( detailed circuit diagram is illustrated in FIG. 6 of U.S. Pat. No. 5,313,155) supplies the cross-coils 11 and 12 with approximated sine and cosine wave currents by changing the direction of the function voltages as described in the prior art patent.

It is noted that the function generator unit FGU according to the first embodiment of the present invention generates approximated sinusoidal wave function voltages which have three deflecting points on each side of the wave slopes while the corresponding function generator unit of the prior art patent generates function voltages which have two deflecting points on each side of the wave slopes.

In other words, triangular voltages converted by the I-V converter 100 and 110 without the function generator unit FGU are formed as illustrated in FIG. 4A and FIG. 4B, while the triangular voltages with the function generator unit FGU are modified by first stage function generators 190 and 200 into voltage waves respectively deflected when the analog voltage VD is V90-Xd and VXd as shown in FIGS. 4C and 4D. These voltage waves are modified by second stage function generators 120 and 130 as shown in FIGS. 4E and 4F. These voltage waves are further modified by function generators 140 and 150 into voltage waves deflected when the respective analog voltage exceed V90-Xc and VXc as shown in FIG. 4G and FIG. 4H. Thus, a pair of approximate sinusoidal voltage waves which have three deflecting points at one side thereof are formed based on the output signal of the F-V converter 50.

Figure 5:
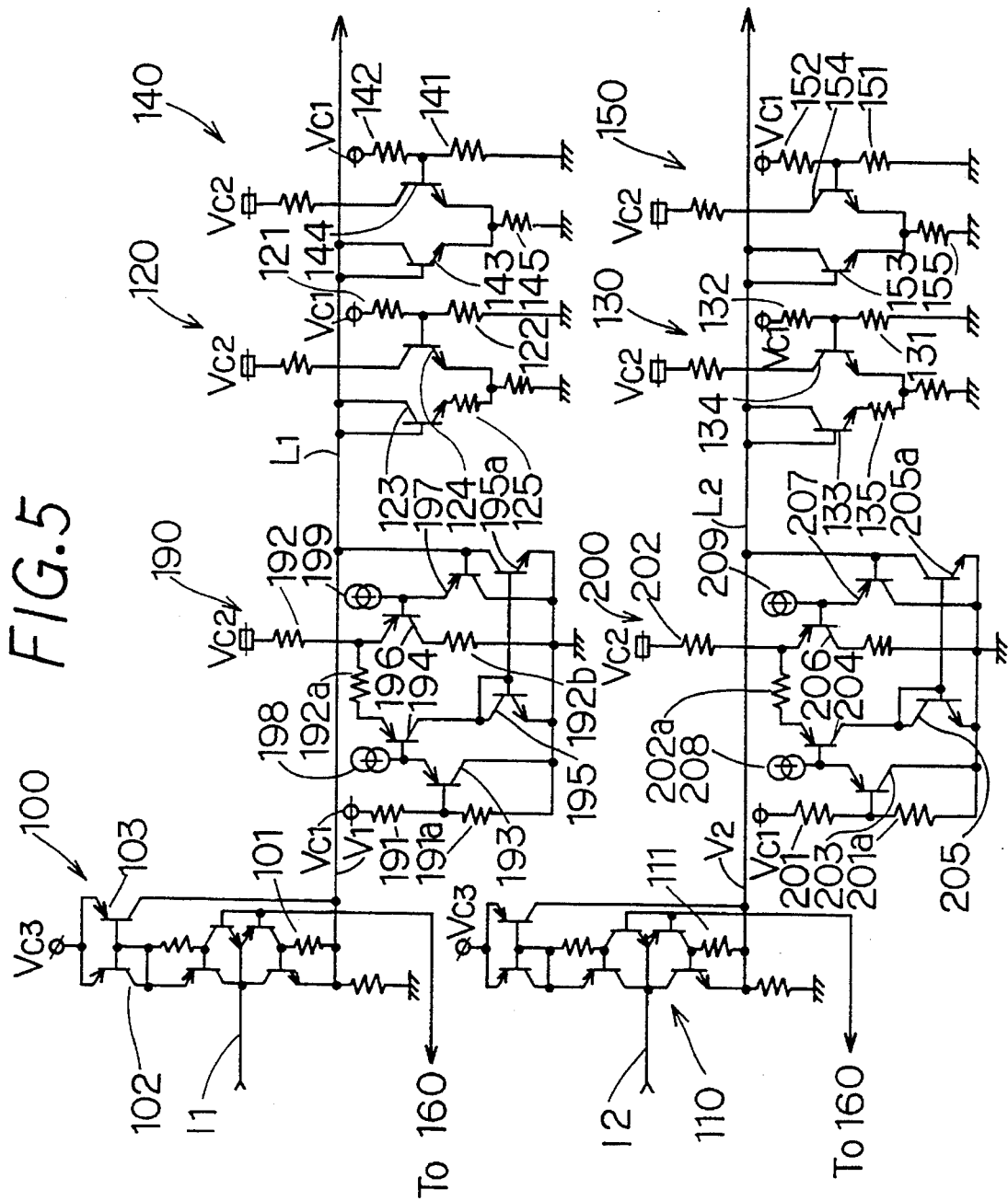
FIG. 5 is a detailed circuit diagram of I-V converters and function generators illustrated in FIG. 1.

Although designations for various output voltages such as V1, V2, etc. in FIG. 1 and Vx1, Vx2, etc. in FIG. 4 are given, each output line of the I-V converters 100 and 110 is a single line and each output voltage-of the function generators 140 and 150 changes as each current flowing through each of the I-V converters 100 and 110 is changed by the function generators shown in FIG. 5.

FIG. 5 shows a detailed circuit diagram which includes the I-V converters 100 and 110 and function generators 120, 130, 140, 150, 190 and 200. The I-V converter 100 and 110 and the function generator 120, 130, 140 and 150 are substantially the same as those of the prior art except that the circuit constants thereof are different.

The function generator 190 which is newly introduced in the embodiment is composed of resistors 191, 191a, 192, 192a and 192b, transistors 193 through 197 and constant voltage sources 198 and 199. Since the base-emitter voltage $V_{BE193}$ of the transistor 193 is equal to the base-emitter voltage $V_{BE197}$ and the base-emitter voltage $V_{BE194}$ of the transistor 194 is equal to the base-emitter voltage $V_{BE\,196}$ of the transistor 196, a voltage divided by the resistors 191 and 191a is compared to a voltage V1 on a line L1 which is an output voltage of the I-V converter 100 which is composed of transistors 102 and 103. The amount of a current which flows through the transistor 195 is given by dividing the balance of the above-compared voltages by the resistance of the resistor 192. Since the transistors 195 and 195a are connected to form a mirror current circuit, the same amount of a current flows through the transistor 195a. Thus, the current flowing through the output line L1 is reduced as desired, and consequently the current flowing through the resistor 101 of the I-V converter 100 reduces. The function generator 190 operates as described above when the output voltage VD of the F-V converter 50 become greater than V90-Xd to change the slope of the voltage applied on the line L1 as shown in FIG. 4C.

In order to have an approximated rectilinear sinusoidal wave voltage having three deflecting points on one side, the function generator is composed of PNP transistors, which are able to provide the lowest level deflecting point nearly at the ground voltage or at a voltage lower than 0.7 V. On the other hand, the first stage function generator of the prior art which corresponds to the function generator 120 of the embodiment consists of NPN transistors 123 and 124 which cannot provide the lowest deflecting point under 0.7 volt and, thereby, the approximated sinusoidal wave cannot have three deflecting points.

In the function generator 120, current i1 flowing through a resistor 125 is given by the following equation:

$$i1=(1/R125)\cdot(V1-V_{BE1}-VA+V_{BE2}),$$

wherein R125 is resistance value of the resistor 125, $V_{BE1}$ and $V_{BE2}$ are, respectively, base-emitter voltages of the transistors 123 and 124 and VA is a voltage divided by resistors 121 and 122.

Thus, the second deflecting point and the slope of the voltage wave on the output line L1 is formed at a range $VD \geq V90-Xb$ as shown in FIG. 4E, which is described in detail in the prior art patent (U.S. Pat. No. 5,313,155).

In the function generator 140, current i2 flowing through a transistor 143 and resistor 145 is given by the following equation, as described in the prior art patent:

$$i2=\{(VB-V_{BE4})/R145\}-I_S\cdot\exp(q\cdot V_{BE4}/KT),$$

wherein VB is a voltage divided by resistors 141 and 142, and $V_{BE4}$ is a base-emitter voltage of a transistor 144.

Thus, the third deflecting point and the slope of the voltage on the output line L1 is formed as shown in FIG. 4G at a range VD≧90−Xc.

In summary, the electric current flowing through the output line L1 is reduced respectively by the function generators 190, 120 and 140 at their different operational points (different analog voltage VD) so that the voltage wave on the output line L1 is modified respectively as shown in FIGS. 4C, 4E and 4G based on the output voltage VD of the F-V converter 50.

The electric current flowing through the output line L2 is also reduced respectively by the function generators 200, 130 and 150 in the same manner as described above to modify the output voltage on the output line L2 into the voltage waves shown in FIGS. 4D, 4F and 4H respectively. That is, the function generator 200 is composed of resistors 201, 201a, 202 and 202a, transistors 203 through 207 and constant voltage sources 208 and 209; the function generator 130 is composed of NPN transistors 133 and 134 and resistors 131, 132 and 135; the function generator 150 is composed of resistors 151, 152 and 155 and transistors 153 and 154; and the I-V converter 110 is composed of transistors and resistors including a resistor 111.

Then, the voltages generated on the output lines L1 and L2 are applied to the driving circuits 170 and 180, which supply each of the cross-coils 11 and 12 with an approximated sine wave current and an approximated cosine wave current respectively as described in the prior art patent.

Figure 7:
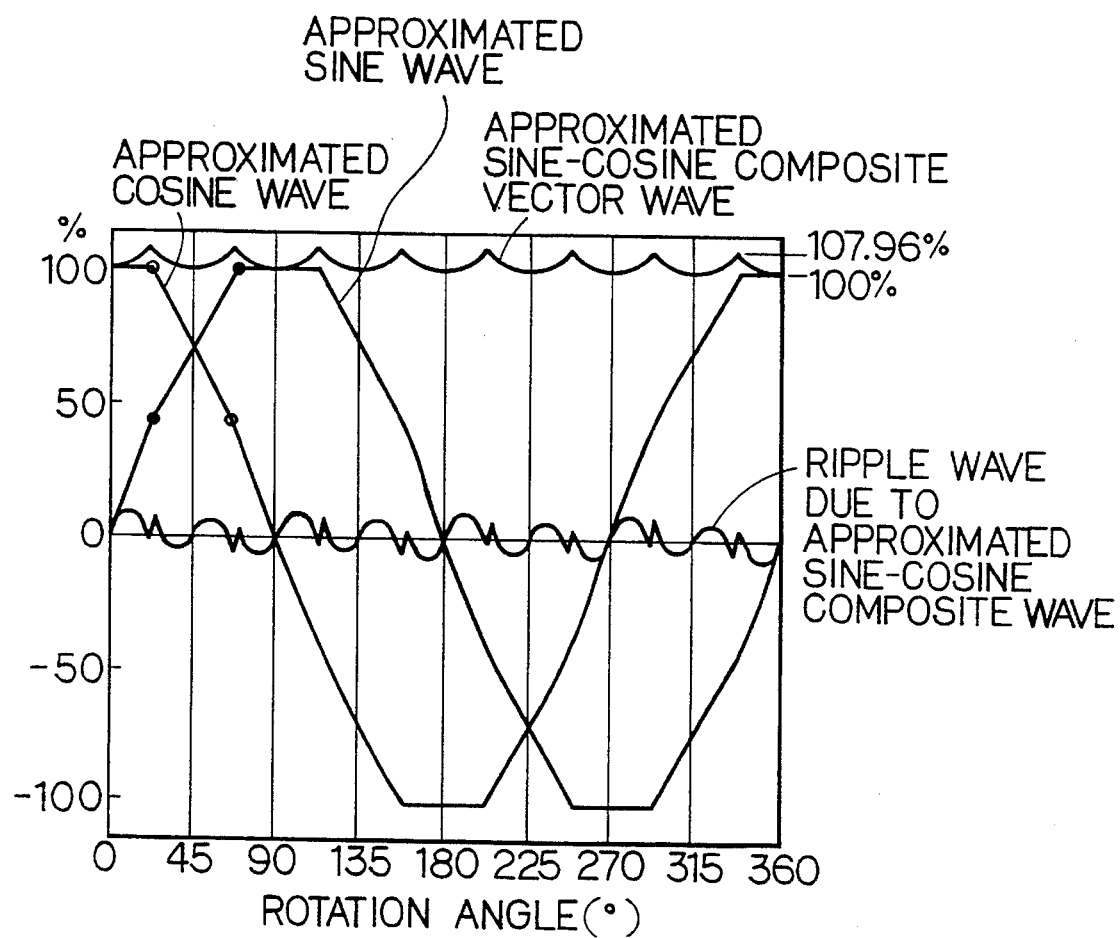
FIG. 7 is a wave-form chart illustrating approximated sine wave, cosine wave and composite vector of the approximated sine and cosine waves generated by a function generator unit of a conventional indicator instrument.

FIG. 6 illustrates an approximated sine wave current and cosine wave current flowing trough each of the cross-coils 11 and 12 and a composite vector wave corresponding to the rotating magnetic force generated by the cross-coils when energized by the approximated sine and cosine wave currents. FIG. 7 illustrates corresponding waves generated in the prior art. It is noted from FIGS. 6 and 7 that ripples of the composite vector wave of the cross-coils of the instrument according to this embodiment of the present invention is much smoother than the ripples of the vector wave of the prior art instrument. As a result, the linearity of the movement of the pointer 14 is much improved in this embodiment.

In other words, the turning angle or position of the pointer 14, which is biased by the hair spring 14a, is determined by the composite magnetic force generated by the cross-coils 11 and 12 and by the magnetic force of the magnets (not shown). If the ripple of the composite vector wave is significant, the pointer 14 is affected by the magnetic force generated due to the ripple. Since the ripple of the composite vector is significantly reduced in this embodiment, linearity of the pointer indication is improved.

In order to provide the approximated sine and cosine waves as shown in FIG. 6 from the voltage waves shown in FIGS. 4G and 4H, the voltage applied to the driving circuit 170 shown in FIG. 4G must become zero at a point where VD is 1 V (where the rotation angle is 180°) and the voltage to be applied to the driving circuit 180 shown in FIG. 4H must become zero at points where VD is 0.5 V (where the rotation angle is 90°) and 1.5 V (where the rotation angle is 270°).

In order to provide the above voltage waves, a current flowing through a resistor 101 of the I-V converter 100 (FIG. 5) must be equal to the input current I1 and a current flowing through a resistor 111 of the I-V converter 110 must be equal to the input current I2.

Figure 8:
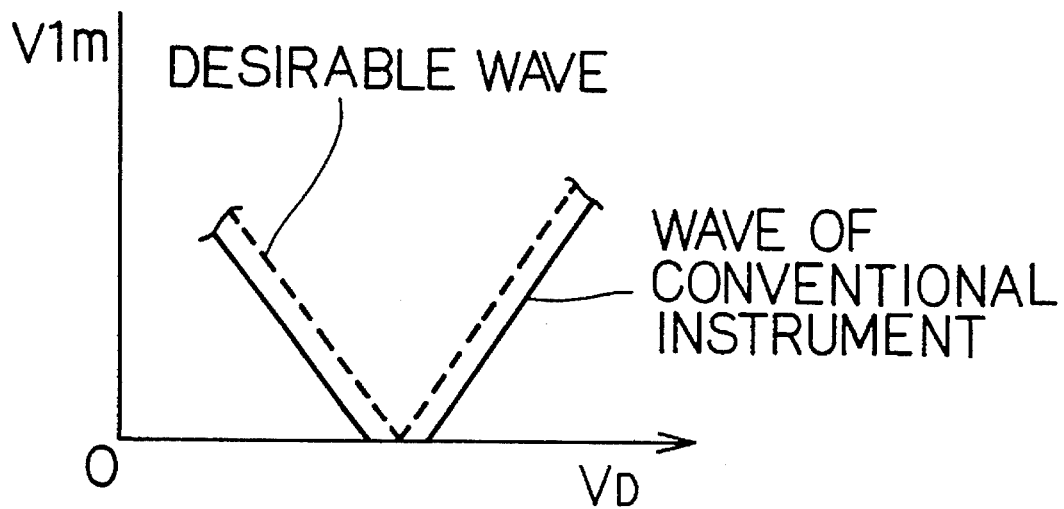
FIG. 8 is a chart illustrating a difference between a desired triangular wave voltage generated by the function generator unit according to the first embodiment of the present invention and a corresponding triangular wave voltage generated in a prior art instrument.

For this purpose, the function generator 190 employs a zero-cross-compensation circuit (or bias current cancelling circuit) which is composed of a constant current source 199 and a transistor 197. The zero-cross compensation circuit supplies a bias current IB to the output line L1. In order to provide an optimum bias current IB, a constant current supplied by the constant current source 199 is amplified by the transistor 197 so that a current, which is $1/h_{EF}$ ($h_{EF}$: coefficient of amplification) as much as the constant current supplied by the constant current source 199 flows through the transistor 195a. Thus, the bias current IB is controlled to be optimum and the voltage wave on the output line L1 is raised to become an ideal wave shape which crosses the zero line only at a set point as shown in FIG. 8.

The function generator 200 also has a zero-cross-compensation circuit which is composed of a constant current source 209 and a transistor 207 and controls the voltage on the output line L2 to become an ideal shape in the same manner as described above.

Figure 9A:
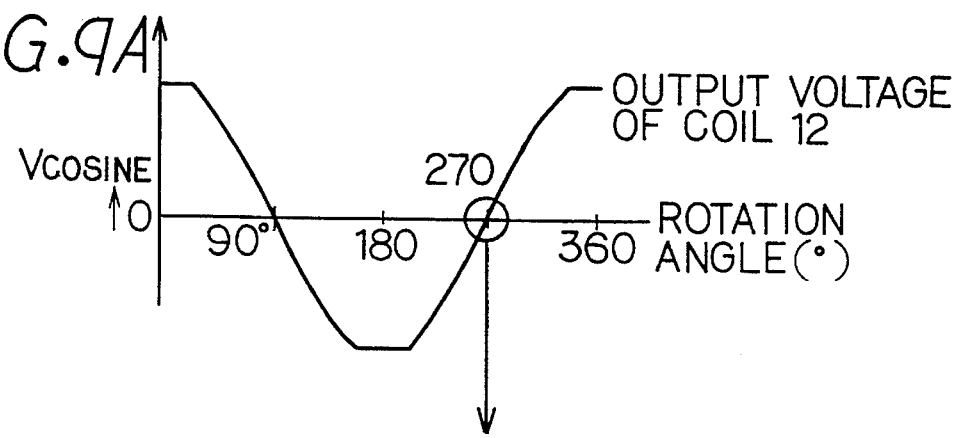
FIGS. 9A, 9B, 9C and 9D are wave-form charts illustrating cosine coil wave current shapes when a bias current IB varies.
Figure 9B:
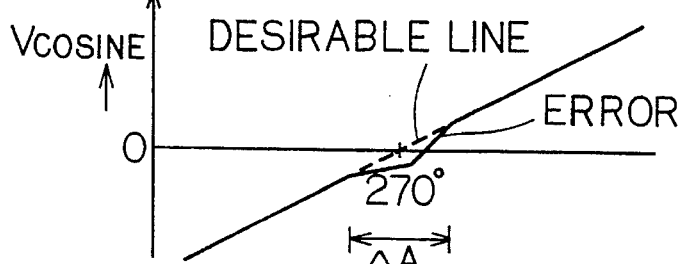
Figure 9C:
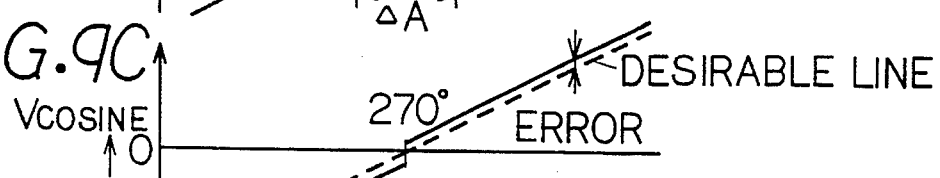
Figure 9D:
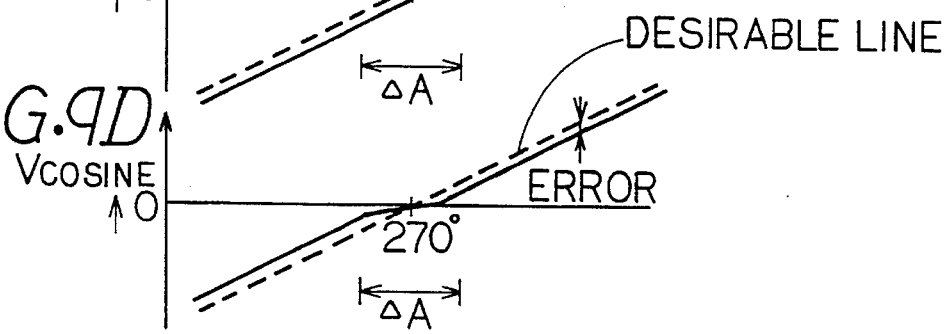

Next, an effect of the bias current IB will be explained. In FIG. 9A, the horizontal axis (X-axis) indicates an output angle and the vertical axis (Y-axis) indicates the voltage applied across the coil 12. FIGS. 9B through 9D show portions of the graph in FIG. 9A adjacent to the rotation angle of 270°.

FIG. 9B shows the voltage wave when an optimum bias current IB is supplied to the output line L2. Although errors exist in a range designated by ΔA, the voltage wave becomes almost ideal.

FIG. 9C shows a voltage wave when an excessive bias current is supplied to the output line L2. In this case, since the voltage changes abruptly at the portion around the rotation angle 270°, jumping of the pointer of the analog indicating instrument may be caused. More errors also rise in the other portion.

FIG. 9D shows a voltage wave when the zero-cross compensating circuit is omitted. In this case, the errors change from minus to plus at the range adjacent to the angle 270°. In this case since the slope of the voltage wave at the range above stated is very small, a stagnation of the pointer may be caused instead of jumping.

As stated above, since the zero-cross compensating circuit provides an optimum bias current IB, it is effective to prevent jumping and stagnation of the pointer. A current flowing through resistor 192 causes the bias current IB to increase, however the current is amplified by the transistors 196 and 197 and becomes $(1/h_{FE})^2$ times as much as it was and becomes negligibly small.

The optimum bias current IB may be provided by utilizing a current flowing through a resistor 192 and a transistor 196 from the constant voltage source VC2. In this case, the current is amplified to become $1/h_{EF}$ times thereof.

Figure 10:
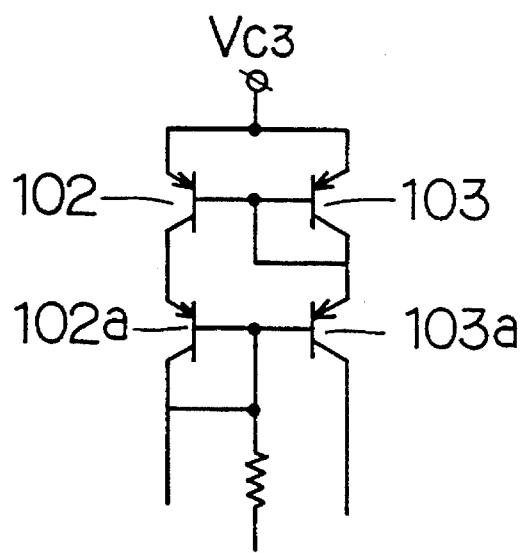
FIG. 10 is a partial circuit diagram of a I-V converter according to another embodiment of the present invention.

As another embodiment, transistors 102a and 103a are connected in series with the respective transistors 102 and 103 in order to equalize the base currents of the transistor 102 and 103 of the I-V converter 100 which comprises a current mirror circuit, as shown in FIG. 10.

In the foregoing discussion of the present invention, the invention has been described with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than a restrictive, sense.

What is claimed is:

1. A driving apparatus for a cross-coil type analog indicating instrument including a pair of coils arranged in quadrature for generating magnetic fields in response to inflow currents thereto, a magnet and a pointer rotating in response to a composite magnetic force of said coils, said indicating instrument comprising:

a sensor for generating an electric signal representing a physical quantity to be indicated;

signal converting means for converting said electric signal into first and second triangular voltage wave signals;

current supplying means connected to said signal converting means for generating an approximated sine wave current and an approximated cosine wave current based on said first and second triangular wave voltage signals to supply said pair of coils; and zero-cross-point compensating means connected to said signal converting means for adjusting deflecting points of said triangular wave voltage signals to zero volts.

2. A driving apparatus for a cross-coil type analog indicating instrument according to claim 1, wherein said signal converting means comprises:

triangular wave voltage forming means for forming said first and second triangular wave voltage signals; and first and second function generators approximating said first and second triangular wave voltage signals to sinusoidal wave voltage signals.

3. A driving apparatus for a cross-coil type analog indicating instrument including a pair of coils arranged in quadrature for generating magnetic fields in response to inflow currents thereto, a magnet and a pointer rotating in response to a composite magnetic force of said coils, said indicating instrument comprising:

a sensor for generating an electric signal representing physical quantity to be indicated;

sawtooth current generating means connected to said sensor for generating first and second sawtooth currents varying according to first and second patterns in response to said electric signal;

I-V converter connected to said sawtooth current generating means for converting said first and second sawtooth currents into first and second triangular wave voltages;

first and second function generators approximating said first and second triangular wave voltages to sinusoidal wave voltages;

current supplying means connected to said first and second function generators for generating an approximated sine wave current and an approximated cosine wave current based on the output voltages of said first and second function generators to supply said pair of coils; and zero-cross-point compensating means connected to said first and second function generators for adjusting deflecting points of said first and second triangular wave voltages to zero volts.

4. A driving apparatus for a cross-coil type analog indicating instrument according to claim 3, wherein at least one of said first and second function generators comprises:

a constant current source; and a current mirror circuit composed of a pair of transistors one of which is connected to an output terminal of one of said I-V converters and a pair of PNP transistors with their emitters connected to said constant current source.

5. A driving apparatus for a cross-coil type analog indicating instrument according to claim 3 wherein, at least one of said function generators comprises a constant voltage source; and a current mirror circuit including a pair of transistors one of which is connected to the output terminal of one of said I-V converters and first and second stage PNP transistors with their base circuits being series-connected between said constant voltage source and the outputs of said one of said pair of transistors.

6. A driving apparatus for a cross-coil type analog indicating instrument according to claim 3 wherein, at least one of said function generators comprises:

a constant voltage source;

a constant current source; and a current mirror circuit composed of a pair of transistors one of which is connected to the output terminal of one of said I-V converters and a pair of first and second stage PNP transistors with their base circuits being connected in series between said constant voltage source and outputs of said pair of transistors, the base circuit of said second stage transistor being connected between said constant current source and said pair of transistors.

7. A driving apparatus for a cross-coil type analog indicating instrument according to claim 3, wherein each of said zero point compensating circuit comprises a constant current source and a transistor having the output circuit connected between said constant current source and a ground and a base circuit connected to an output terminal of said I-V converter.

8. A driving apparatus for a cross-coil type analog indicating instrument according to claim 3, wherein each of said I-V converter comprises a current mirror circuit having a pair of current controlling PNP transistors and a constant voltage source connected to emitters of said pair of transistors, and the output terminal of said current mirror circuit is connected to each of said first and second function generators.

9. A driving apparatus for a cross-coil type analog indicating instrument according to claim 8, wherein each of said mirror circuit further comprises a pair of compensating transistors each of which is series connected to each of said current controlling transistors for equalizing the base currents thereof.

10. A driving apparatus for a cross-coil type analog indicating instrument according to claim 2, wherein said zero-cross-point compensating means is connected to said first and second function generators.

11. A driving apparatus for a cross-coil type analog indicating instrument according to claim 2, wherein said triangular wave voltage forming means comprises a current mirror circuit for controlling said zero-cross-point compensating means according to a bias current flowing therethrough.

* * * * *